United States Patent [19]
Sato et al.

[11] Patent Number: 5,137,248
[45] Date of Patent: Aug. 11, 1992

[54] STRUCTURE FOR MOUNTING ELASTIC MEMBER TO CASING OF ELECTRONIC EQUIPMENT

[75] Inventors: Toshiyuki Sato; Shuichiro Wakayama, both of Tokyo, Japan

[73] Assignee: Kabushiki Kaisha Toshiba, Kawasaki, Japan

[21] Appl. No.: 627,860

[22] Filed: Dec. 17, 1990

[30] Foreign Application Priority Data

Dec. 19, 1989 [JP] Japan ............... 1-145414[U]

[51] Int. Cl.⁵ ............................. F16M 13/00
[52] U.S. Cl. ................... 248/634; 425/129.1; 425/DIG. 56
[58] Field of Search ............. 248/634, 633, 632, 638, 248/686, 687, 688, 615, 677, 188.8, 188.9; 267/141; 264/259, 279; 425/129.1, DIG. 56; 361/331, 380, 392, 394, 395, 399

[56] References Cited

U.S. PATENT DOCUMENTS

| | | | |
|---|---|---|---|
| 2,072,244 | 3/1937 | Coursen | 248/632 |
| 2,225,093 | 12/1940 | Avery | 248/615 |
| 4,134,955 | 1/1979 | Hanrahan | 264/259 |
| 4,626,962 | 12/1986 | Ahn et al. | 361/394 X |
| 4,744,009 | 5/1988 | Grabbe et al. | 361/394 X |
| 4,785,523 | 11/1988 | Koseki | 264/259 |
| 4,842,095 | 6/1989 | Rozek | 248/634 |
| 4,969,066 | 11/1990 | Eibl et al. | 361/392 X |
| 4,999,068 | 3/1991 | Chiarella | 264/279 |
| 5,001,603 | 3/1991 | Villaneuva | 248/615 |

FOREIGN PATENT DOCUMENTS

1020994  12/1957  Fed. Rep. of Germany ...... 248/634

*Primary Examiner*—David M. Purol
*Attorney, Agent, or Firm*—Finnegan, Henderson, Farabow, Garrett and Dunner

[57] ABSTRACT

A structure for mounting elastic members such as legs to a casing of an electronic equipment, wherein, when the casing of the electronic equipment provided therein with holes for mounting the elastic member is subjected to an injection molding with use of elastic material to provide the elastic member, the elastic member is integrally mounted to the casing of the electronic equipment.

18 Claims, 5 Drawing Sheets

STRUCTURE FOR MOUNTING ELASTIC MEMBER TO CASING OF ELECTRONIC EQUIPMENT

BACKGROUND OF THE INVENTION

1. Field of the Invention

The present invention relates to structures in casings of electronic equipments and more particularly, to a structure for mounting an elastic member made of such material as rubber to a casing of an electronic equipment.

2. Description of the Related Art

Conventionally, it has been often required to mount elastic members made of rubber or the like which perform various functions onto the surface or inside of a casing of an electronic equipment.

As an example, when taking up a telephone set as one of the electronic equipments and looking at the bottom casing of the telephone set, it will perhaps be found, on the bottom casing, legs of elastic members made of rubber or the like. It is often required to mount such elastic legs on the bottom casing to prevent undesirable slip of the telephone set and to stabilize the telephone set when the telephone set is installed.

Now explanation will be made as to a conventional structure for mounting elastic members to a casing of an electronic equipment by referring to FIGS. 6 and 7 showing an example wherein legs of elastic members are to be mounted to the bottom casing of a telephone set.

FIGS. 6(a), 6(b) and 6(c) show top, side and bottom views of a tray-shaped casing bottom plate 101 which forms a part of the casing of the telephone set, respectively.

As shown in FIG. 6(c), ring-shaped projections 103 are provided as extended downwardly on the back side of the tray-shaped casing bottom plate 101 at four corners, and disk-shaped legs 102 made of an elastic material such as rubber are embedded into the projections 103.

Meanwhile, in order to embed the legs 102 into the ring-shaped projections 103, it has been so far common practice to apply such bonding means as a double-coated tape 104 onto the upper side of each of the legs 102 and then to embed into the ring-shaped projections 103 each leg 102 with the double-coated tape 104 applied on its upper side so as not to be escaped therefrom, as shown in FIG. 7 showing a magnified cross-sectional view of a section A in FIG. 6(b).

It goes without saying that the height of the aforementioned legs 102 is set so that the tip end of the leg extrudes outwardly from the tip end of the projection 103.

Such a conventional elastic-member mounting structure as mentioned above, however, has a demerit that, since such bonding means as the double-coated tape 104 is applied to the elastic leg member 102 and then such leg members 102 are embedded one after another into the openings of the ring-shaped projections 103 integrally formed with the casing, it requires the number of steps necessary for mounting the elastic members to be large, which disadvantageously results in that not only this requires a lot of assembling work time but the work time is also correspondingly increased as the number of the elastic members increases. The conventional mounting structure has been defective also in that the elastic leg members are mounted to the casing of the electronic equipment through such bonding means as the double-coated tape, which results in that the elastic members tend to easily escape from the casing as the bonding means is subjected to aging or variation with time or external vibration or the like influence.

For the purpose of preventing such escape or dropout, it has been conventionally considered to partially fit the elastic leg members into the openings of the casing of the electronic equipment. Even in this case, however, like the aforementioned conventional mounting structure, this structure has been also disadvantageous in that works for fitting the elastic members into the casing of the electronic equipment are troublesome, thus requiring the increased number of mounting steps and correspondingly the increased mounting time.

SUMMARY OF THE INVENTION

In view of the above circumstances, it is an object of the present invention to provide a structure for mounting an elastic member to a casing of an electronic equipment with a less number of assembling steps.

Another object of the present invention is to provide a structure for mounting an elastic member to a casing of an electronic equipment, which can prevent easy escape of the elastic member from the casing of the electronic equipment.

In accordance with an aspect of the present invention, the above objects are attained by a structure for mounting an elastic member to a casing of an electronic equipment, in which holes for mounting the elastic member are formed in the casing of the electronic equipment and the elastic member is mounted into the holes of the casing by injection molding so as to be formed integrally with the casing of the electronic equipment.

Other objects and advantages offered by the invention will be apparent from the following detailed description and from the attached drawings.

DESCRIPTION OF THE PREFERRED EMBODIMENTS

Structures for mounting elastic members to a casing of an electronic equipment in accordance with embodiments of the present invention will be explained in detail.

In the following embodiments, explanation will be made in connection with the case where a casing of a telephone set is used as the casing of the electronic equipment and the elastic members are mounted as legs to the bottom casing of the telephone set.

Figure 1A:
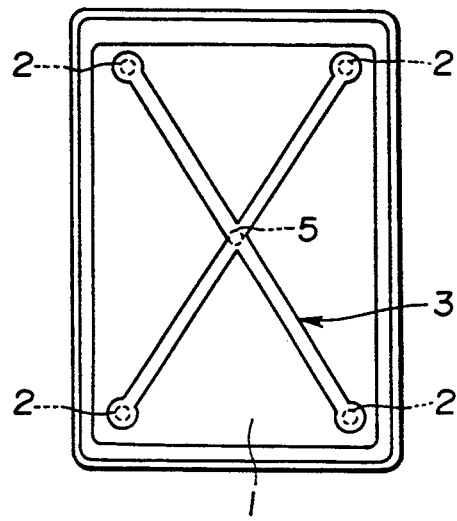
FIGS. 1(a), 1(b) and 1(c) are top, side and bottom views of a mounting structure in accordance with the present invention, showing a state wherein an elastic member is mounted to a casing bottom plate of a telephone set, respectively.
Figure 1B:
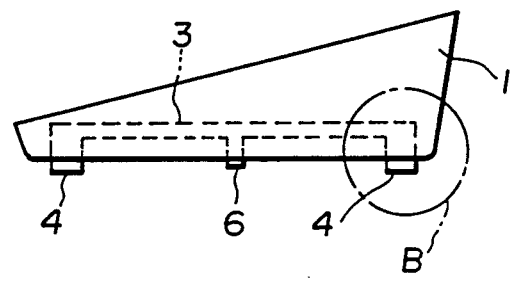
Figure 1C:
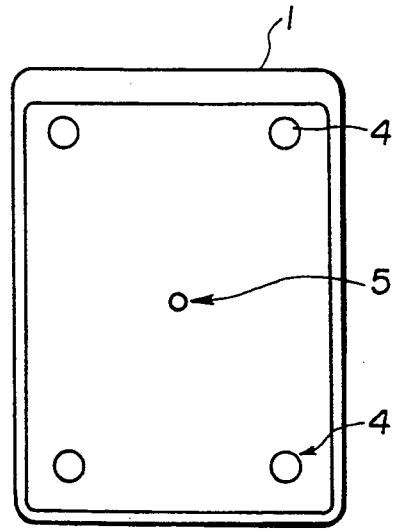

Referring first to FIGS. 1(a), 1(b) and 1(c), there are shown top, side and bottom views of a bottom plate 1 of a casing of a telephone set, to which a structure for mounting an elastic member in accordance with the present invention is applied, respectively.

The casing bottom plate 1 of the telephone set, which is shaped in a tray form, is made of a plastic or metallic material.

Figure 2:
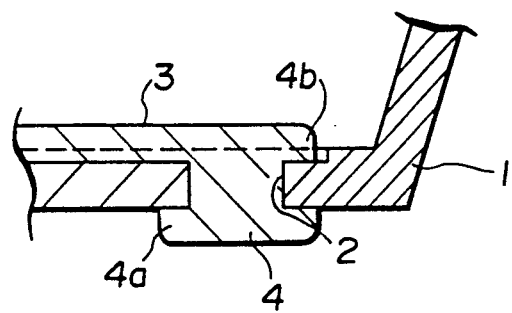
FIG. 2 is an enlarged cross-sectional view of a major part in FIG. 1(b)

Shown in FIG. 2 is an enlarged cross-sectional view of a section B in FIG. 1(b). As shown in the drawing, holes 2 for mounting an elastic member are made in that parts of the casing bottom plate 1 which are located at its four corners and to which the elastic member in the form of legs is to be mounted.

When an injection molding of the elastic member is performed to the casing bottom plate 1 having such a structure, the casing bottom plate 1 is formed therein-side with a letter-X-shaped communication path 3 along the proceeding direction of an injection molding material so as to connect the holes 2 provided at four corners of the casing bottom plate in the shortest distance as shown in FIG. 1(a); and the injection molding material overflows from the respective holes 2 at the final ends of the communication path 3 onto the surface of the casing bottom plate 1 to thereby form a plurality of legs 4 as the elastic member projected therefrom, which legs are simultaneously integrally mounted to the casing bottom plate 1, as shown in FIG. 2.

As shown in FIG. 2, since the leg 4 comprises two disk-shaped members 4a and 4b which have a diameter larger than the hole 2 and which are connected to each other through the hole 2, the leg 4 can be prevented from being escaped from the casing bottom plate 1.

For the purpose of forming the legs 4 integrally with each other by means of the injection molding, a hole 5 for injection of the injection molding material is provided in the casing bottom plate 1 as shown in FIG. 1(c). More specifically, the hole 5 is located at a position corresponding to an intersection of the two diagonal lines connected between the holes 2 at the four corners of the casing bottom plate 1, and in other words, in the center of the letter X of the path 3 corresponding to its intersection in FIG. 1(a).

The hole 5 is also subjected to a slip-out treatment to form an engagement 6 (refer to FIG. 1(b)) having the same structure as the leg 4 in FIG. 2, whereby it can be prevented that the X-shaped communication path 3 rises as demounted from the casing bottom plate 1.

Explanation will next be directed to the details of the aforementioned injection molding to realize the integral mounting of the legs 4 to the casing bottom plate 1.

Figure 3:
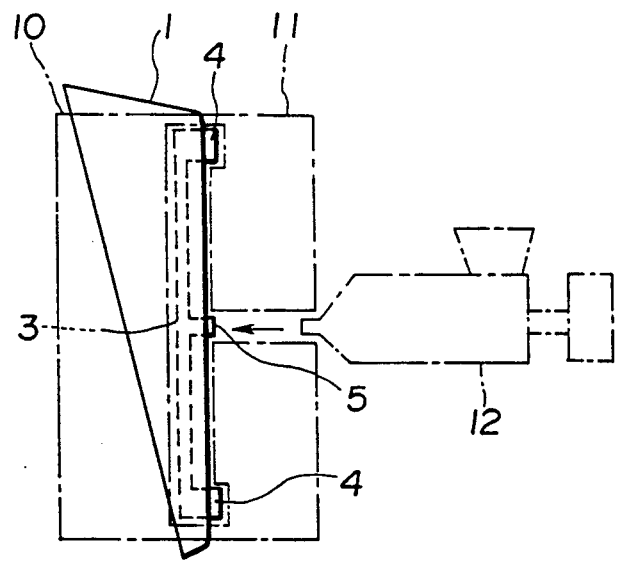
FIG. 3 is a diagram for explaining the principle of an injection molding method.

The casing bottom plate 1, which is provided therein with the holes 2 for mounting the legs 4 and the hole 5 for injection of the injection molding material as shown in FIGS. 1 and 2, is disposed between a pair of left and right molds 10 and 11 having predetermined shapes as conceptionally shown in FIG. 3, and then melted injection molding material, in the illustrated example, thermoplastic elastomer (such as polyurethane rubber) is injected from an injection molding machine through the hole 5 into the molds 10 and 11 and the injected elastomer flows through passages formed in the molds 10 and 11 as shown by an arrow in FIG. 3. Thereafter, after the mold 10 is released from the mold 11 and the casing bottom plate 1 is cooled, the legs 4, X-shaped communication path 3 and engagement 6 are integrally formed as shown in FIGS. 1 and 2 and at the same time, these members are integrally mounted to the casing bottom plate 1. In this connection, such injection molding of the elastic member in the post-steps is known as the out-sert molding or injection two-color molding in Japan.

In this way, in accordance with the foregoing elastic-member mounting structure, the elastic member, in the present embodiment, a plurality of the legs 4 are provided at the same time at the four corners of the casing bottom plate 1 by means of the injection molding, whereby the number of steps necessary for mounting the elastic member to the casing of the electronic equipment can be reduced to a large extent.

Although detailed explanation has been made in connection with the case where mainly the plurality of legs 4 are integrally formed by means of the injection molding of the elastic members and at the same time, are integrally mounted to the casing bottom plate 1 in the foregoing embodiment, the present invention is not limited to the above specific example but the legs 4 as well as board holding means in the form of elastic member for holding a printed circuit board inside the casing bottom plate 1 as engaged therewith may be integrally formed by means of the elastic-member injection molding.

Figure 4:
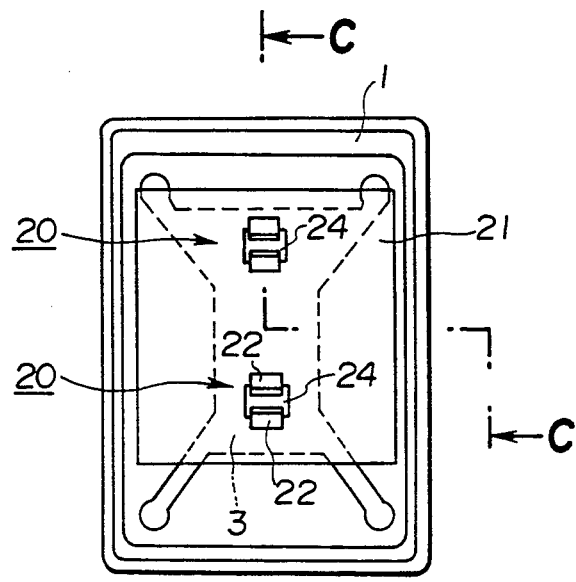
FIG. 4 is a plan view of a casing bottom of a telephone set as another embodiment.
Figure 5:
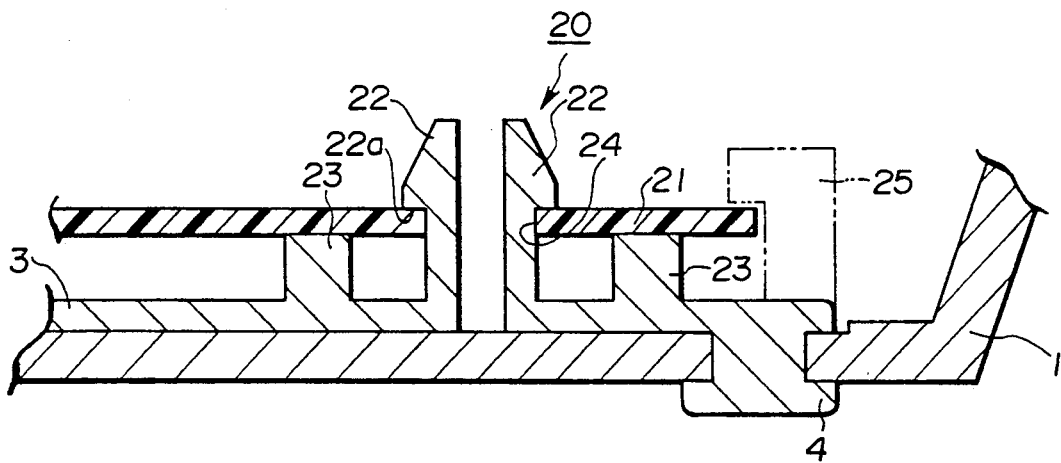
FIG. 5 is an enlarged cross-sectional view of a major part in FIG. 4 as viewed from line C—C.
Figure 6A:
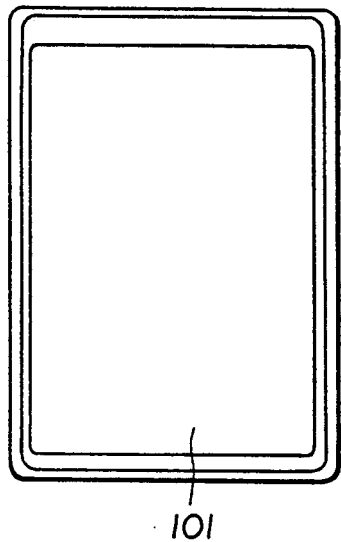
FIGS. 6(a), 6(b) and 6(c) are top, side and bottom views of a conventional mounting structure showing a state wherein elastic members are mounted to a casing bottom plate of a telephone set, respectively.
Figure 6B:
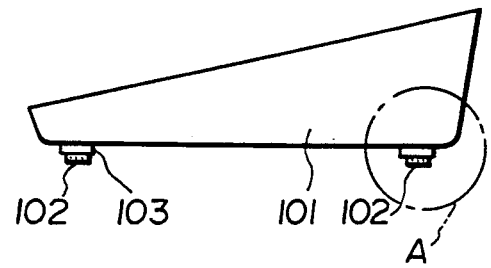
Figure 6C:
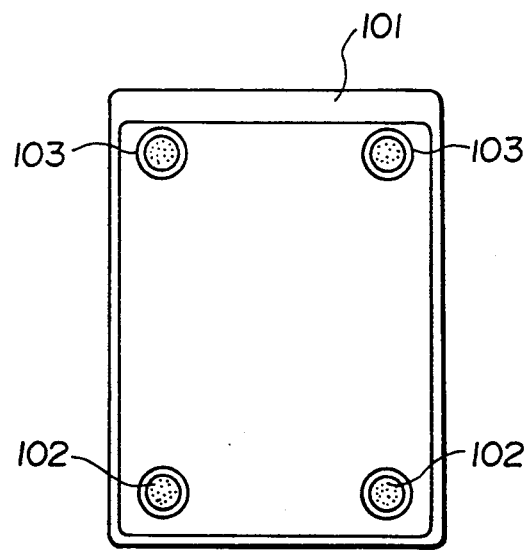
Figure 7:
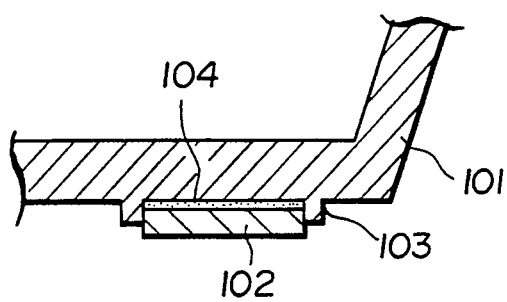
FIG. 7 is an enlarged cross-sectional view of a major part in FIG. 6(b).

FIGS. 4 is a plan view of the casing bottom plate 1 and FIG. 5 is a cross-sectional view of the same plate taken along line C—C, when the aforementioned legs 4 as well as a pair of board holding means 20 in the form of elastic members for holding a printed circuit board 21 inside the casing bottom plate 1 as engaged therewith may be integrally formed by means of the elastic-member injection molding. In FIGS. 4 and 5, the same parts as those in FIGS. 1 to 3 are denoted by the same reference numerals.

More in detail, the pair of board holding means 20 for holding the printed circuit board 21 are integrally formed with the communication path 3 by means of the injection molding inside the casing bottom plate 1. The board holding means 20 may be formed by modifying the molding-material passage provided in the mold 10 of FIG. 3.

As shown in FIG. 5, the board holding means 20 includes a pair of divided board holding nails 22 of an umbrella shape provided with respective nail portions 22a and a pair of board supporting bases 23 lower in height than the nail portions 22a, the pair of board supporting bases 23 being integrally provided to straddle the board holding nails 22 in the vicinity thereof.

Meanwhile, as shown in FIG. 4, the printed circuit board 21 to be disposed inside the casing bottom plate 1 is provided therein with rectangular openings 24 at positions opposed to the board holding nails 22 of the board holding means 20. When the board holding nails 22 of the board holding means 20 are inserted into and fitted to the associated openings 24, the two divided board holding nails 22 are engaged at their nail portions 22a to the peripheral edges of the openings 24 of the printed circuit board 21 so that the board holding nails 22 can be prevented from being escaped from the printed circuit board 21 and can positively hold the board 21 between the upper surfaces of the board supporting bases 23 and the nail portions 22a to ensure its positioning and holding, as shown in FIG. 5.

The lower the height of the board supporting bases 23 is made the less flexible the printed circuit board 21 becomes, thus resulting in that the circuit board 21 is more suitably held.

The board holding means 20 may include, in addition to the aforementioned board holding nails 22 and board supporting bases 23, a nail portion 25 of an L shaped section which is integrally formed with the communication path 3 by means of the injection molding to be engaged with a peripheral edge of the printed circuit board 21 as shown by a two-dot chain line in FIG. 5.

Accordingly, with the mounting structure of the aforementioned embodiment, the term "elastic members" include not only the legs 4 but also the board holding means 20.

Though the legs 4 and board holding means 20 have been detailed as the elastic members to be mounted to the casing of the electronic equipment in the foregoing embodiments, the present invention is not restricted to the particular examples. For example, the elastic members to be integrally formed by means of the injection molding and also to be integrally mounted to the casing may comprise elastic support members for supporting a small size loudspeaker disposed within the casing of an electronic equipment or elastic hooks projected from the outside of the casing of an electronic equipment.

As has been explained in the foregoing, in accordance with the present invention, a plurality of elastic members to be mounted to the casing of the electronic equipment can be provided at a time to the casing by means of the injection molding, whereby the number of assembling steps necessary for mounting the elastic members to the casing of the electronic equipment can be reduced to a large extent.

The present invention may be modified in various ways so long as they are included within the spirit and scope of the invention as defined not by the contents of the present specification but by the appended claims. Therefore, it is to be clearly understood that the foregoing embodiments are given only by way of example and the present invention should not be limited by the embodiments. Thus, all alternatives, modifications and equivalents may be included within the scope of the appended claims.

What is claimed is:

1. A structure for mounting an electronic equipment including a circuit board, comprising:
   a casing for the electronic equipment; and
   an elastic member mounted to said casing;
   wherein said casing includes a hole for mounting said elastic member and said elastic member is adapted for mounting the printed circuit board thereon, said elastic member being formed to extend from said hole by means of injection molding; and
   said elastic member including printed circuit board holding means for holding the printed circuit board, said printed circuit board holding means being integrally formed with said elastic member at the time of performing the injection molding.

2. A structure as set forth in claim 1, wherein said casing of said electronic equipment is a casing bottom plate of a telephone set.

3. A structure as set forth in claim 1, wherein said casing includes a plurality of holes for mounting said elastic member in said casing of the electronic equipment.

4. A structure as set forth in claim 1, wherein said elastic member is a leg for said casing of the electronic equipment.

5. A structure as set forth in claim 1, wherein the printed circuit board has a hole, and wherein said printed circuit board holding means includes a board holding nail having a nail portion with an umbrella-shaped cross section being divided into two parts at an end thereof which abuts against a front surface of the printed circuit board when fitted into the hole of the printed circuit board, said board holding means further including a board supporting base which abuts against a back surface of the printed circuit board when the board holding nail is fitted into the hole of the printed circuit board, whereby the printed circuit board is held by the nail portion of said board holding nail and the board supporting base when said board holding nail is fitted into the hole of the printed circuit board.

6. A structure as set forth in claim 1, wherein the printed circuit board has a hole, and wherein said printed circuit board holding means includes a board holding nail having a nail portion with an umbrella-shaped cross section being divided into two parts at an end thereof which abuts against a front surface of the printed circuit board when fitted into the hole of the printed circuit board, said board holding means further including a board supporting base which abuts against a back surface of the printed circuit board when said board holding nail is fitted into the hole of the printed circuit board, and a nail member having an L-shaped cross section for engagement with a peripheral edge of the printed circuit board when said board holding nail is fitted into the hole of the printed circuit board, whereby the printed circuit board is held by the nail portion of said board holding nail and the board supporting base and the peripheral edge of the printed circuit board is held by said nail member having the L-shaped cross section when said board holding nail is fitted into the hole of the printed circuit board.

7. A structure as set forth in claim 1, wherein said elastic member is a thermoplastic elastomer.

8. A structure as set forth in claim 7, wherein said thermoplastic elastomer is polyurethane rubber.

9. A structure for mounting an electronic equipment including a printed circuit board, comprising:
   a casing for the electronic equipment; and
   an elastic member mounted to said casing;
   wherein said casing includes a hole for mounting said elastic member and said elastic member is adapted for maintaining the a printed circuit board thereon, said elastic member being formed to extend from said hole by means of injection molding, said casing including an elastic communication path formed on a back side thereof by an injection molding material flowed toward said hole when performing the injection molding, said elastic communication path having printed circuit board holding means for holding the printed circuit board and integrally formed with said elastic communication path by the injection molding material when peforming the injection molding.

10. A structure as set forth in claim 9, wherein said casing of said electronic equipment is a casing bottom plate of a telephone set.

11. A structure as set forth in claim 9, wherein said casing includes a plurality of holes for mounting said elastic member in said casing of said electronic equipment.

12. A structure as set forth in claim 9, wherein said elastic member is a leg for said casing of the electronic equipment.

13. A structure as set forth in claim 9, wherein said elastic communication path has substantially an X-shaped configuration.

14. A structure as set forth in claim 13, wherein said casing of the electronic equipment is provided with an injection hole for injecting the injection molding material, said injection hole being located at a position corresponding to a center of the X-shaped communication path.

15. A structure as set forth in claim 9, wherein the printed circuit board has a hole, and wherein said printed circuit board holding means includes a board holding nail having a nail portion with an umbrella-shaped cross section being divided into two parts at an end thereof which abuts against a front surface of the printed circuit board when fitted into the hole of the printed circuit board, said board holding means further including a board supporting base which abuts against a back surface of the printed circuit board when said board holding nail is fitted into the hole of the printed circuit board, whereby the printed circuit board is held by the nail portion of said board holding nail and said board supporting base when said board holding nail is fitted into the hole of the printed circuit board.

16. A structure as set forth in claim 9, wherein the printed circuit board has a hole, and wherein said printed circuit board holding means includes a board holding nail having a nail portion with an umbrella-shaped cross section being divided into two parts at an end thereof which abuts against a front surface of the printed circuit board when fitted into the hole of the printed circuit board, said board holding means further including a board supporting base which abuts against a back surface of the printed circuit board when said board holding nail is fitted into the hole of the printed circuit board, and a nail member having an L-shaped cross section for engagement with a peripheral edge of the printed circuit board when the board holding nail is fitted into the hole of the printed circuit board, whereby the printed circuit board is held by the nail portion of said board holding nail and said board supporting base and the peripheral edge of the printed circuit board is held by said nail member of the L-shaped cross section when said board holding nail is fitted into the hole of the printed circuit board.

17. A structure as set forth in claim 9, wherein said elastic member is a thermoplastic elastomer.

18. A structure as set forth in claim 17, wherein said thermoplastic elastomer is polyurethane rubber.

\* \* \* \* \*